(12) United States Patent
Lee et al.

(10) Patent No.: US 11,865,969 B2
(45) Date of Patent: Jan. 9, 2024

(54) OPTICAL ASSEMBLY AND REAR-VIEW MIRROR ASSEMBLY HAVING SAME

(71) Applicant: LG INNOTEK CO., LTD., Seoul (KR)

(72) Inventors: Dong Hyun Lee, Seoul (KR); Kwang Hyun Ko, Seoul (KR)

(73) Assignee: LG INNOTEK CO. LTD., Seoul (KR)

( * ) Notice: Subject to any disclaimer, the term of this patent is extended or adjusted under 35 U.S.C. 154(b) by 2 days.

(21) Appl. No.: 17/791,012

(22) PCT Filed: Jan. 19, 2021

(86) PCT No.: PCT/KR2021/000726
§ 371 (c)(1),
(2) Date: Jul. 6, 2022

(87) PCT Pub. No.: WO2021/149993
PCT Pub. Date: Jul. 29, 2021

(65) Prior Publication Data
US 2023/0331147 A1 Oct. 19, 2023

(30) Foreign Application Priority Data

Jan. 23, 2020 (KR) .................. 10-2020-0009175
Sep. 3, 2020 (KR) .................. 10-2020-0112397

(51) Int. Cl.
*B60Q 3/258* (2017.01)
*B60R 1/12* (2006.01)
(Continued)

(52) U.S. Cl.
CPC ............. *B60Q 3/258* (2017.02); *B60Q 9/008* (2013.01); *B60R 1/1207* (2013.01); *F21K 9/60* (2016.08); *F21Y 2115/10* (2016.08)

(58) Field of Classification Search
CPC ........... B60Q 3/258; B60Q 9/008; F21K 9/60; B60R 1/1207
See application file for complete search history.

(56) References Cited

U.S. PATENT DOCUMENTS 7,771,062 B2 8/2010 Kuhn et al.
8,469,563 B2 6/2013 Hwang et al.
(Continued)

FOREIGN PATENT DOCUMENTS

EP 1970736 9/2008
EP 2933550 10/2015
(Continued)

OTHER PUBLICATIONS

Extended European Search Report dated May 16, 2023 issued in Application No. 21744260.7.
(Continued)

*Primary Examiner* — Christopher E Dunay
(74) *Attorney, Agent, or Firm* — KED & ASSOCIATES

(57) ABSTRACT

The optical assembly disclosed in the embodiment of the invention includes: a lighting module having a resin layer and a light emitting device inside the resin layer, and having an exit surface for emitting surface light to one side; a reflective portion having a recess in a lower portion of the exit side of the lighting module and an aspherical curved surface at the bottom of the recess; and a transparent cover on the recess to reflect the surface light to a set region.

20 Claims, 15 Drawing Sheets

(51) Int. Cl.
  *B60Q 9/00* (2006.01)
  *F21K 9/60* (2016.01)
  *F21Y 115/10* (2016.01)

(56) References Cited

U.S. PATENT DOCUMENTS

| | | | |
|---|---|---|---|
| 8,708,536 B1* | 4/2014 | Mathieu | B60Q 1/2665 |
| | | | 362/494 |
| 8,911,102 B2 | 12/2014 | Holman et al. | |
| 9,227,557 B2* | 1/2016 | Chen | B60R 1/1207 |
| 9,440,580 B2* | 9/2016 | Mathieu | B60Q 1/2665 |
| 9,791,122 B2 | 10/2017 | Yang et al. | |
| 10,252,674 B2 | 4/2019 | Park et al. | |
| 10,300,836 B2 | 5/2019 | Chae et al. | |
| 10,539,294 B2* | 1/2020 | Kürschner | B60Q 1/2607 |
| 10,589,675 B1* | 3/2020 | Huang | G02B 6/0046 |
| 10,953,805 B2 | 3/2021 | Park et al. | |
| 11,098,874 B2* | 8/2021 | He | F21S 43/26 |
| 11,164,993 B2 | 11/2021 | Kang et al. | |
| 11,407,360 B1* | 8/2022 | Huang | F21S 43/245 |
| 11,450,786 B2 | 9/2022 | Kang et al. | |
| 11,658,266 B2 | 5/2023 | Kang et al. | |
| 11,718,230 B2* | 8/2023 | Ruel | B60R 1/12 |
| | | | 359/838 |
| 2008/0225417 A1 | 9/2008 | Kuhn et al. | |
| 2011/0211360 A1 | 9/2011 | Kuhn et al. | |
| 2012/0195034 A1 | 8/2012 | Kuo | |
| 2012/0206930 A1 | 8/2012 | Minikey, Jr. et al. | |
| 2015/0329047 A1 | 11/2015 | Park et al. | |
| 2018/0326895 A1 | 11/2018 | Chae et al. | |
| 2019/0039508 A1 | 2/2019 | Mi et al. | |
| 2019/0137052 A1* | 5/2019 | Hwang | F21V 29/70 |
| 2019/0193638 A1 | 6/2019 | Park et al. | |
| 2020/0335660 A1 | 10/2020 | Kang et al. | |
| 2022/0020897 A1 | 1/2022 | Kang et al. | |
| 2022/0055541 A1* | 2/2022 | Kobayashi | B60R 1/06 |
| 2022/0393064 A1 | 12/2022 | Kang et al. | |

FOREIGN PATENT DOCUMENTS

| | | |
|---|---|---|
| EP | 3211298 | 8/2017 |
| JP | 2012-131277 | 7/2012 |
| KR | 10-2011-0076787 | 7/2011 |
| KR | 10-1551079 | 9/2015 |
| KR | 20190088684 | 7/2019 |
| WO | WO 2014/004667 | 1/2014 |
| WO | WO 2019/098596 | 5/2019 |

OTHER PUBLICATIONS

International Search Report dated Apr. 28, 2021 issued in Application No. PCT/KR2021/000726.

* cited by examiner

OPTICAL ASSEMBLY AND REAR-VIEW MIRROR ASSEMBLY HAVING SAME

CROSS-REFERENCE TO RELATED PATENT APPLICATIONS

This application is a U.S. National Stage Application under 35 U.S.C. § 371 of PCT Application No. PCT/KR2021/000726, filed Jan. 19, 2021, which claims priority to Korean Patent Application Nos. 10-2020-0009175, filed Jan. 23, 2020 and 10-2020-0112397, filed Sep. 3, 2020, whose entire disclosures are hereby incorporated by reference.

TECHNICAL FIELD

An embodiment of the invention relates to an optical assembly for emitting surface light.

An embodiment of the invention relates to an optical assembly that generates and reflects surface light to be emitted through a mirror of a moving object, and a rear-view mirror assembly having the same.

BACKGROUND ART

Lighting applications include vehicle lights as well as backlights for displays and signage. A light emitting device, for example, a light emitting diode (LED), has advantages such as low power consumption, semi-permanent life, fast response speed, safety, and environmental friendliness compared to conventional light sources such as fluorescent lamps and incandescent lamps. These light emitting diodes are applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. However, since a directivity angle of light emitted from the light emitting diode is small, when the light emitting diode is used as a vehicle lamp, there is a demand for increasing the light emitting area of the lamp using the light emitting diode. Since the light emitting diode is small, it may increase the design freedom of the lamp, and it is economical due to its semi-permanent life.

For example, the light emitting diode may be applied to a blind spot detection (BSD) system. The blind spot detection system is a system that detects other vehicles located behind and to the side of the driver with a sensor device of the vehicle, and provides information about it to the driver through visual, auditory, tactile, and the like. In such the blind spot detection system, a light emitting diode may be disposed in a side mirror, a rear-view mirror, or an A-pillar region of a vehicle to visually provide rear sight information to the driver.

However, as light is emitted in various directions from the light emitting diodes, there is a problem in that visual information is not effectively provided to the driver. In addition, there is a problem in that the light emitted from the light emitting diode may be emitted in the direction of the driver of another vehicle, thereby obstructing the view and causing an accident. Recently, research has been conducted on a rear-view mirror for a moving object or vehicle using a light source together with a mirror.

DISCLOSURE

Technical Problem

An embodiment of the invention may provide an optical assembly having a light source module emitting surface light and an aspherical reflective surface that reflects the surface light in a set direction. An embodiment of the invention may provide an optical assembly having an aspherical reflective surface that reflects the surface light in a set direction to a part of a housing in which a light source module emitting surface light is accommodated. An embodiment of the invention may provide an optical assembly and a rear-view mirror assembly for reflecting laterally emitted surface light in a direction set by an aspherical reflective portion disposed on a concave bottom of a housing. An embodiment of the invention may provide an optical assembly and a rear-view mirror assembly capable of illuminating a surface light reflected within a housing through an indicator. An embodiment of the invention may provide a rear-view mirror assembly having an optical assembly or a side mirror of a moving object.

Technical Solution

An optical assembly according to an embodiment of the invention includes: a lighting module having a resin layer and a light emitting device inside the resin layer, and having an exit surface for emitting light to one side; a reflective portion having a recess in a lower portion of an exit side of the lighting module and an aspherical curved surface at a bottom of the recess; and a transparent cover on the recess.

According to an embodiment of the invention, the optical assembly comprises a support portion having a receiving portion in which the lighting module is disposed; and an inner sidewall extending from the support portion to a lower end of the reflective portion; and an outer sidewall disposed around an upper portion of the reflective portion and the support portion, wherein the curved surface of the reflective portion may have a gradually deeper depth as it is adjacent to a lower end of one side of the exit surface. The curved surface of the reflective portion may have a gradually higher height from a lower end of the one side to a lower end of the other side of the exit surface. According to an embodiment of the invention, the lighting module includes a substrate on which the light emitting device is disposed; a first reflective member on the resin layer; a second reflective member between the resin layer and the substrate, wherein the resin layer may seal the light emitting device, and the exit surface may be disposed parallel to a light emitting surface of one side of the light emitting device. According to an embodiment of the invention, a height of the exit surface of the lighting module may be a same as a thickness of the resin layer, the thickness of the resin layer may be 4 mm or less, and an upper surface of the support portion may be flat. An upper end of the curved surface in the reflective portion may be disposed equal to or lower than a straight line extending horizontally with respect to the lower surface of the lighting module, and a periphery of the transparent cover may be disposed in a stepped portion disposed on the outer sidewall. A length of a first side surface adjacent to the one side of the resin layer may be longer than a length of a second side surface opposite to the first side surface. According to an embodiment of the invention, the housing may include the reflective portion, the support portion, the inner sidewall and the outer sidewall, and a reflective layer of a metallic material may be formed on the reflective portion. According to an embodiment of the invention, a light blocking member disposed on upper surfaces of the housing and the transparent cover and having an opening portion overlapping the recess.

A rear-view mirror assembly according to an embodiment of the invention includes: a housing including a support portion having a receiving portion in one region and a reflective portion having a concave recess in another region; a lighting module disposed in the receiving portion and having an exit surface exposed toward the recess; a transparent cover disposed on the receiving portion and the recess; and a light blocking member disposed on an upper surface of the housing and the transparent cover and having an opening portion in a partial region overlapping the recess, wherein a bottom of the recess has a curved surface having a deeper depth toward a lower end of one side of the exit surface, wherein the lighting module includes a substrate, a light emitting device on the substrate, and a resin layer covering the light emitting device, and emits surface light to the exit surface, and the surface light is reflected by the reflective portion and passes through the opening portion may be emitted.

According to an embodiment of the invention, a back plate and a rear-view mirror may have the housing accommodated therein. Also, it may include at least one indicator formed on at least one region of the rear-view mirror and the light blocking member.

Advantageous Effects

According to an embodiment of the invention, the optical assembly may emit surface light, and may have improved luminous intensity and improved light uniformity. In addition, the optical assembly may suppress the formation of hot spots in the illumination region and minimize the loss of light.

According to an embodiment of the invention, a line-shaped surface light provided in the horizontal direction may be condensed in a direction set by the aspherical reflector, so that the luminance value of the light provided in the set direction may be controlled. According to an embodiment of the invention, the optical assembly may maximize light emitted from the rear-view mirror while minimizing light loss, and may adjust a luminance value of light according to a set direction. Accordingly, the rear-view mirror may provide light of relatively high luminance to the driver of the moving object, and may provide light of relatively low luminance to another moving object located at the rear side of the moving object. Accordingly, it is possible to prevent or minimize interference with the driver of the moving object located at the rear side by the light emitted from the mirror. An optical assembly and a rear-view mirror assembly having the same according to an embodiment of the invention can improve reliability of an alarm device.

BEST MODE

Figure 1:
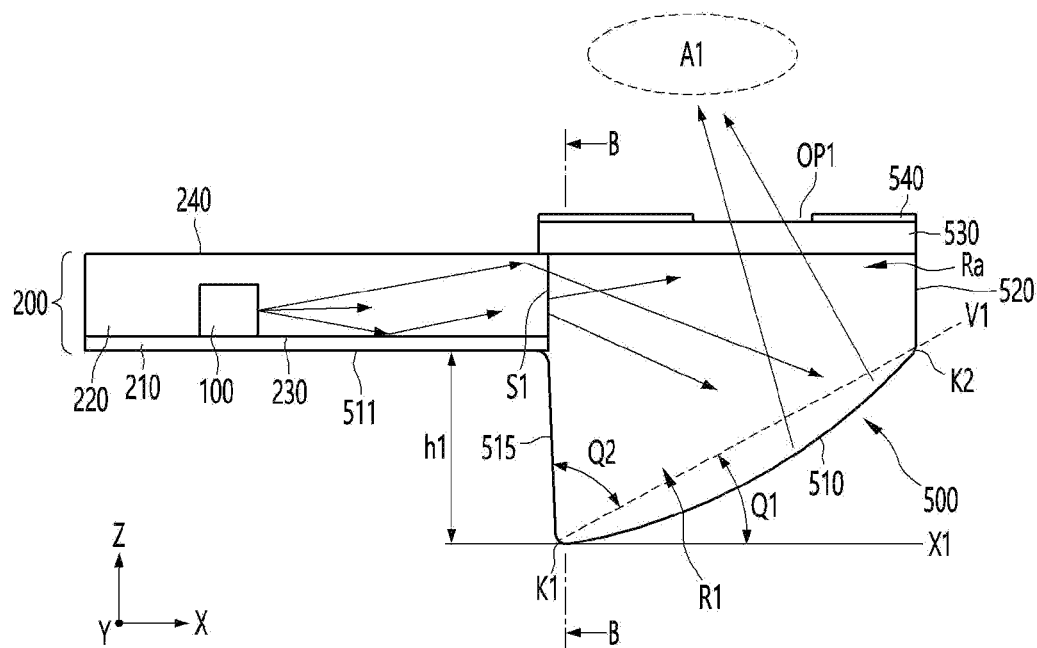
FIG. 1 is a side cross-sectional view conceptually showing an optical assembly according to an embodiment of the invention.

Hereinafter, with reference to the accompanying drawings will be described in detail preferred embodiments that may be easily carried out by the person of ordinary skill in the art. However, it should be understood that the configurations shown in the embodiments and drawings described in this specification are only preferred embodiments of the invention, and that there may be various equivalents and modifications that can replace them at the time of application. In the detailed description of the operating principle for the preferred embodiment of the invention, when it is determined that a detailed description of related known functions or configurations may unnecessarily obscure the subject matter of the invention, the detailed description will be omitted. Terms to be described later are terms defined in consideration of functions in the invention, and the meaning of each term should be interpreted based on the contents throughout the present specification. The same reference numerals are used for parts having similar functions and functions throughout the drawings. The technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

The lighting module or the optical assembly according to the invention may be applied to a variety of lamp devices that require lighting, such as vehicle lamps, home lighting devices, or industrial lighting devices. For example, when applied to vehicle lamps, it is applicable to headlamps, sidelights, side mirrors, fog lights, tail lamps, brake lights, daytime running lights, vehicle interior lights, door scars, rear combination lamps, backup lamps, etc. The lighting module or the optical assembly of the invention may be applied to indoor and outdoor advertising devices, display devices, and various electric vehicle fields, and in addition, it may be applied to all lighting-related fields or advertisement-related fields that are currently developed and commercialized or that may be implemented according to future technological developments.

<Optical Assembly>

Figure 2:
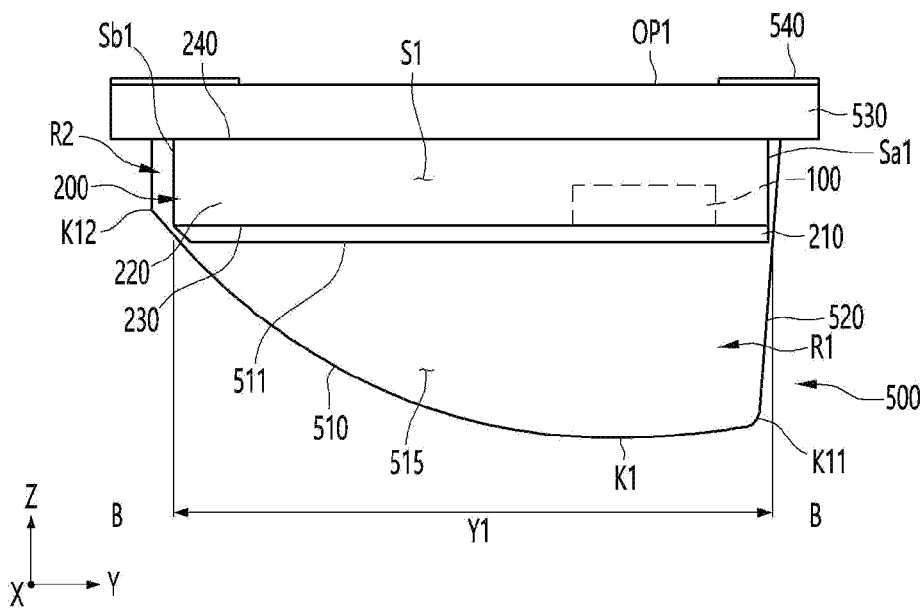
FIG. 2 is a view viewed from the B-B side in the optical assembly of FIG. 1.
Figure 3:
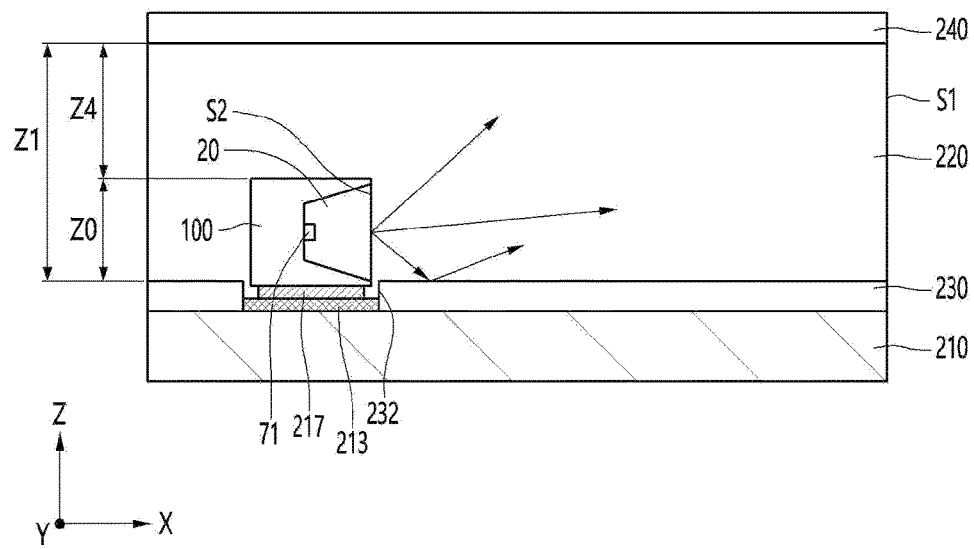
FIG. 3 is a side cross-sectional view illustrating an example of a lighting module of the optical assembly of FIG. 1.
Figure 4:
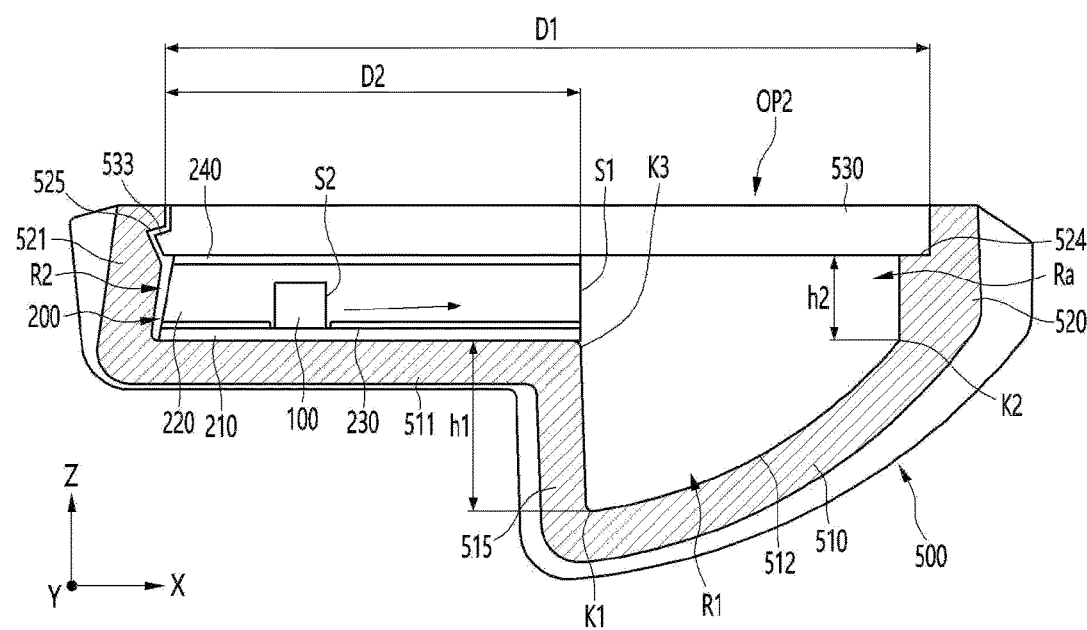
FIG. 4 is a view illustrating a housing, a lighting module, and a transparent cover of an optical assembly according to an embodiment of the invention.
Figure 5:
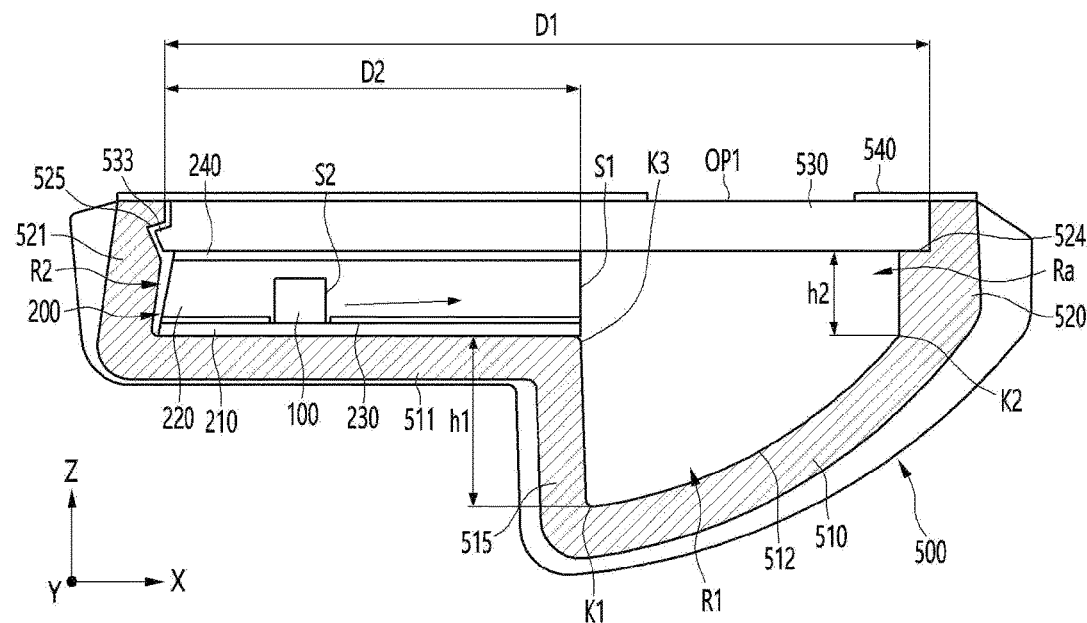
FIG. 5 is an example in which a light blocking member having an opening portion is stacked in the optical assembly of FIG. 4.
Figure 6:
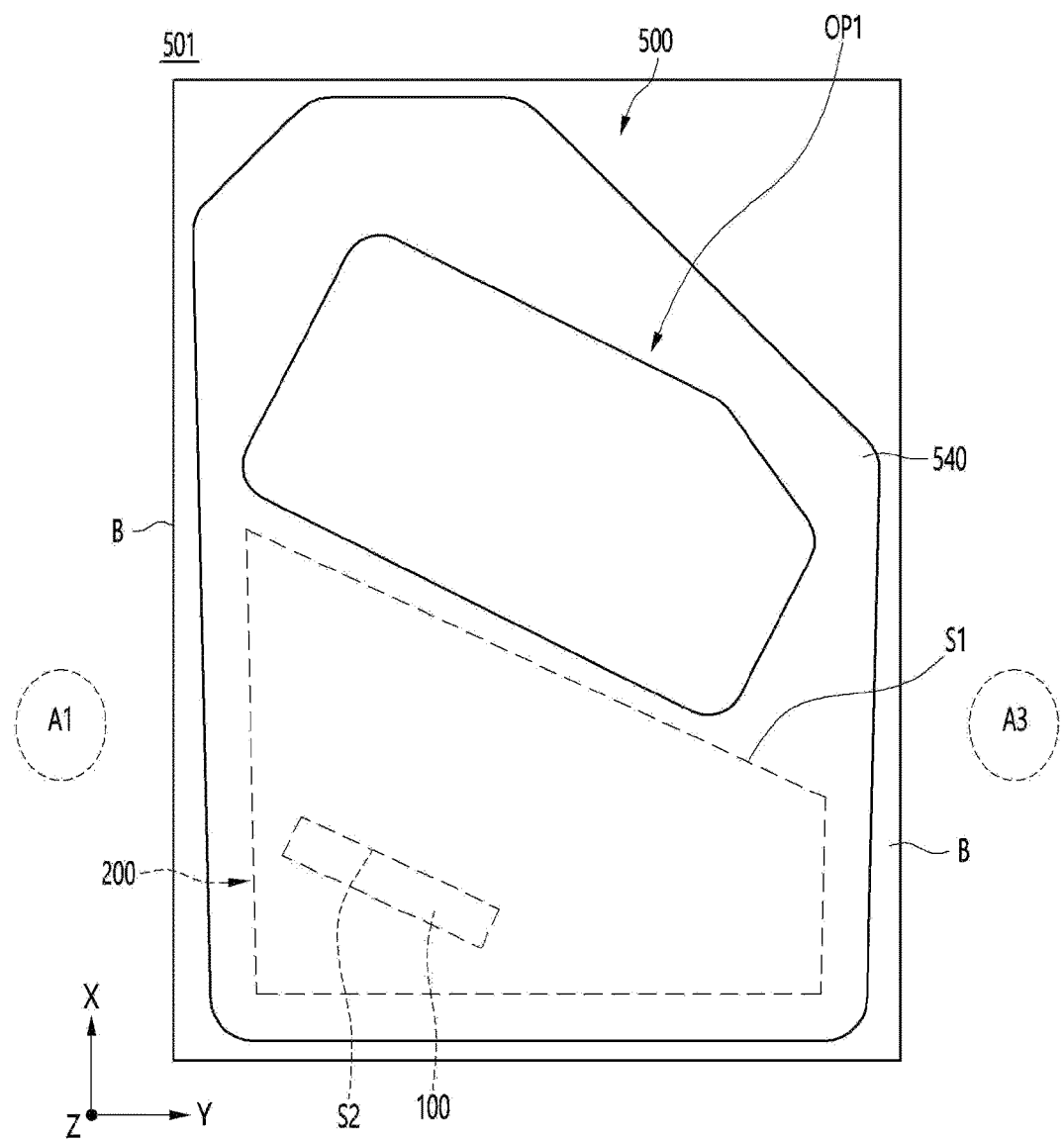
FIG. 6 is an example of a front view of the optical assembly of FIG. 5.
Figure 7:
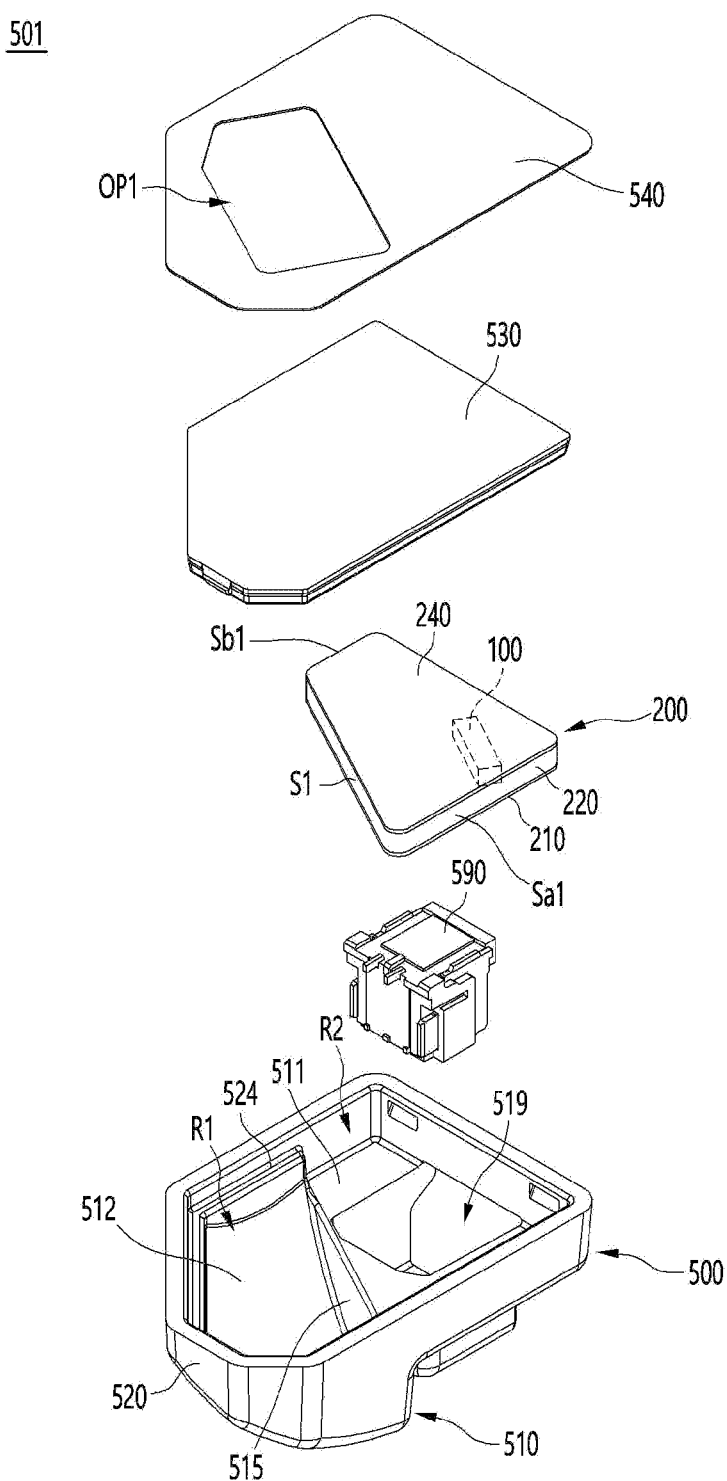
FIG. 7 is an example of an exploded perspective view of the optical assembly of FIG. 6.
Figure 8:
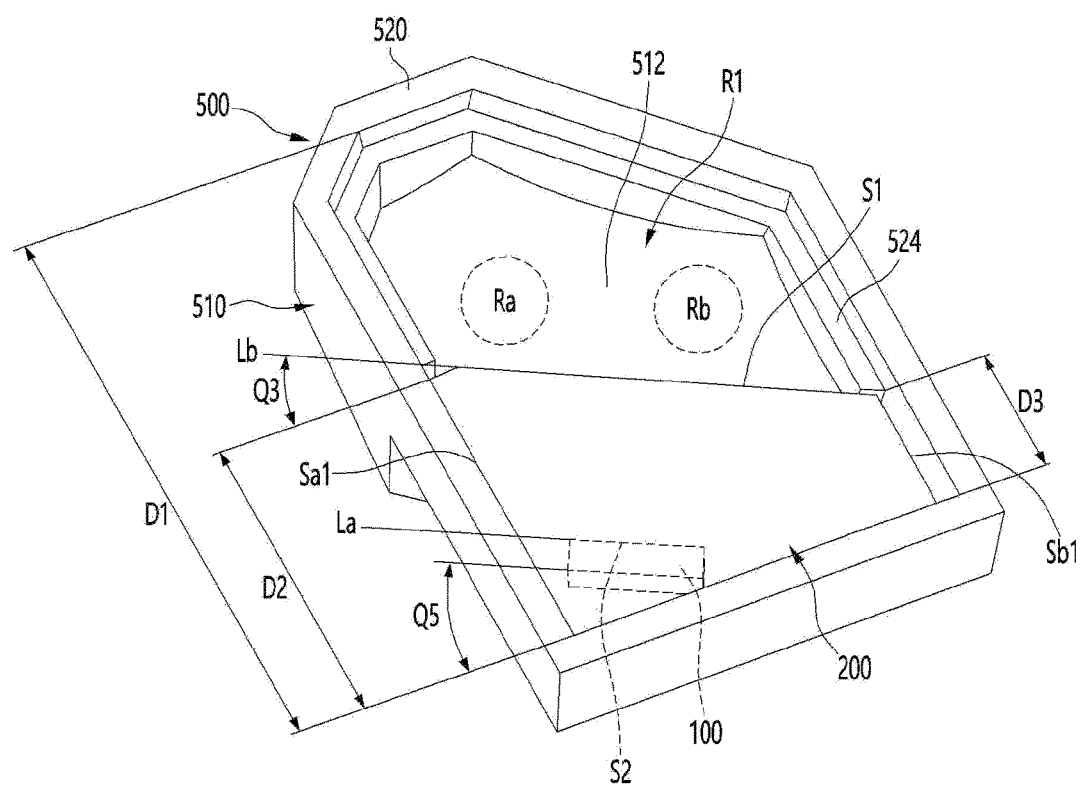
FIG. 8 is a perspective view in which the lighting module is coupled to the housing in the optical assembly of FIG. 6.
Figure 9:
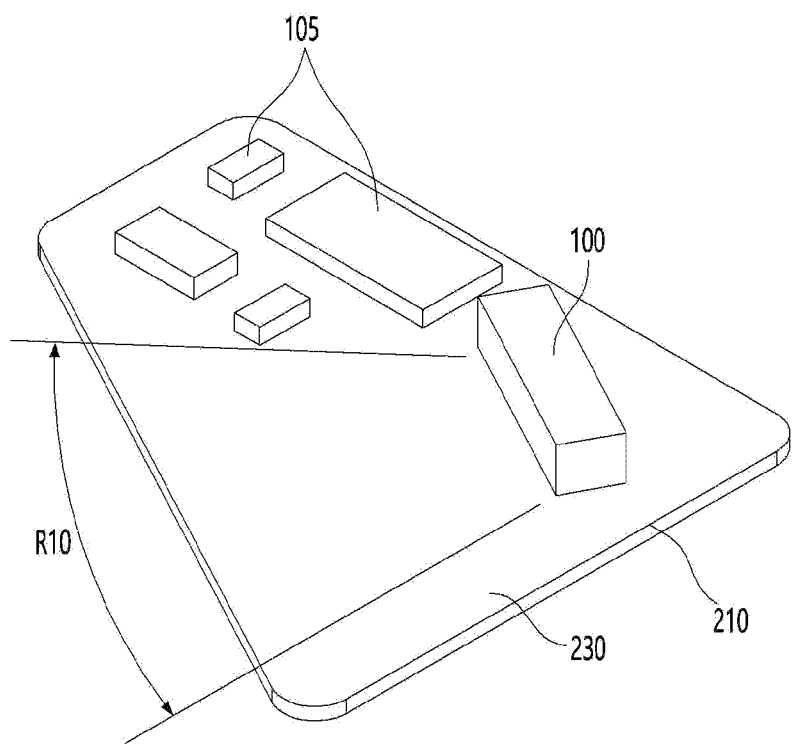
FIG. 9 is a perspective view of a substrate on which a light emitting device and components are mounted in the lighting module of FIG. 4.
Figure 10:
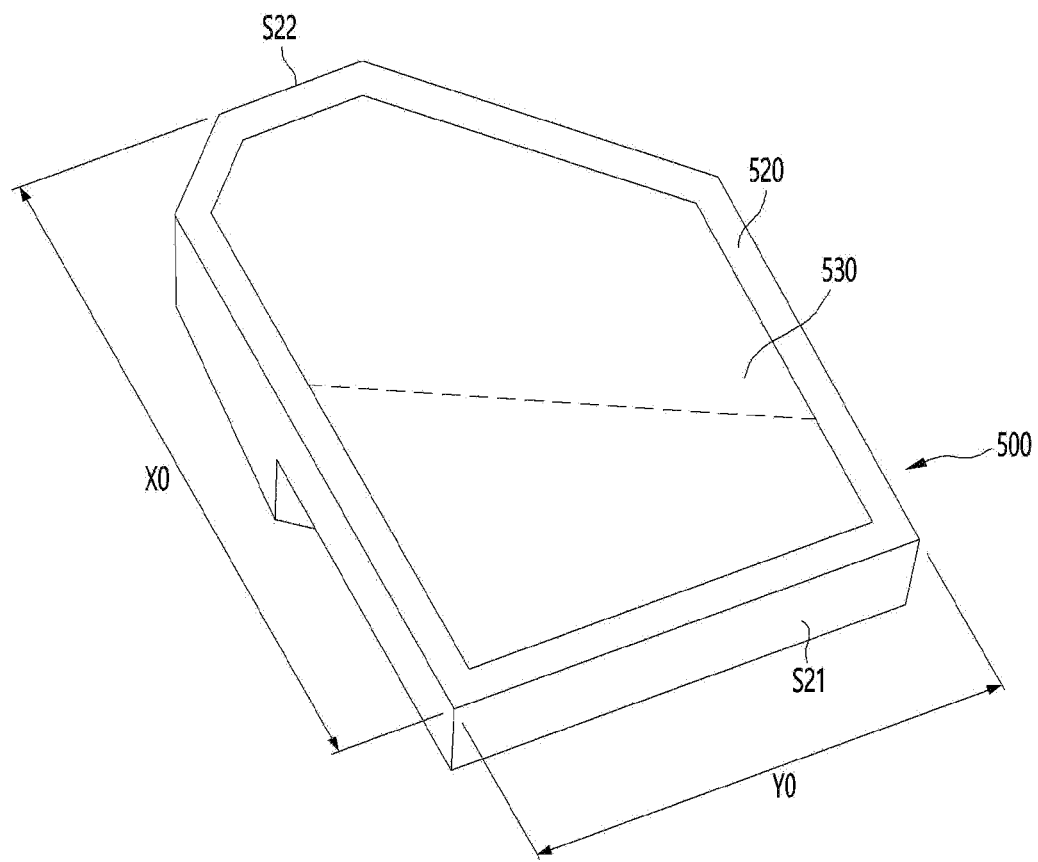
FIG. 10 is a perspective view in which a transparent cover is coupled to the housing in FIG. 7.
Figure 11:
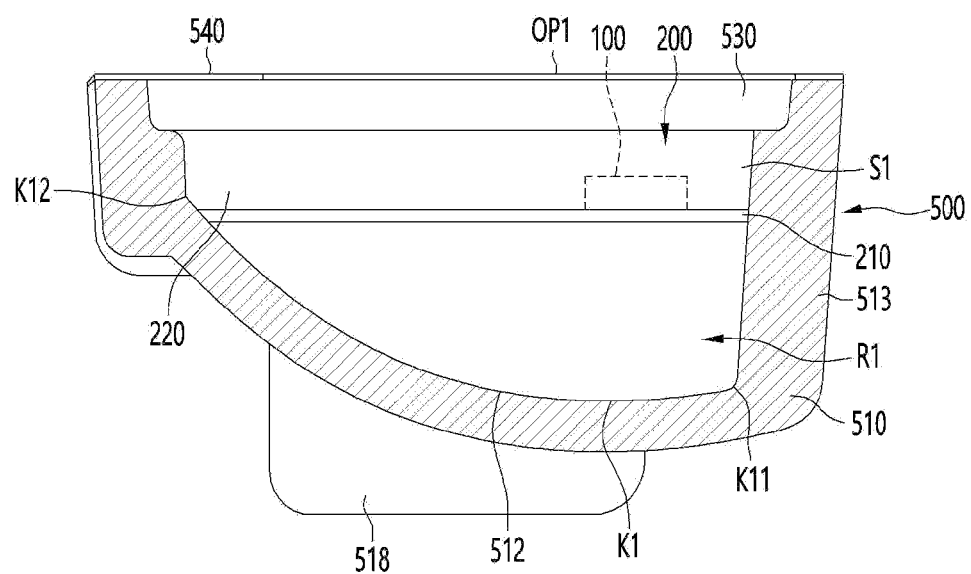
FIG. 11 is an example of a cross-sectional view taken along the B-B side of the optical assembly of FIG. 6.
Figure 12A:
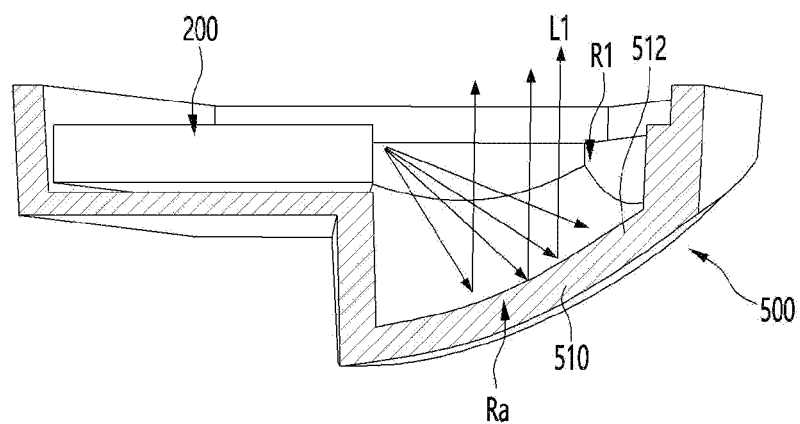
FIGS. 12A and 12B are views illustrating a reflective path in the concave reflective portion of the housing of the optical assembly of FIG. 8.
Figure 13:
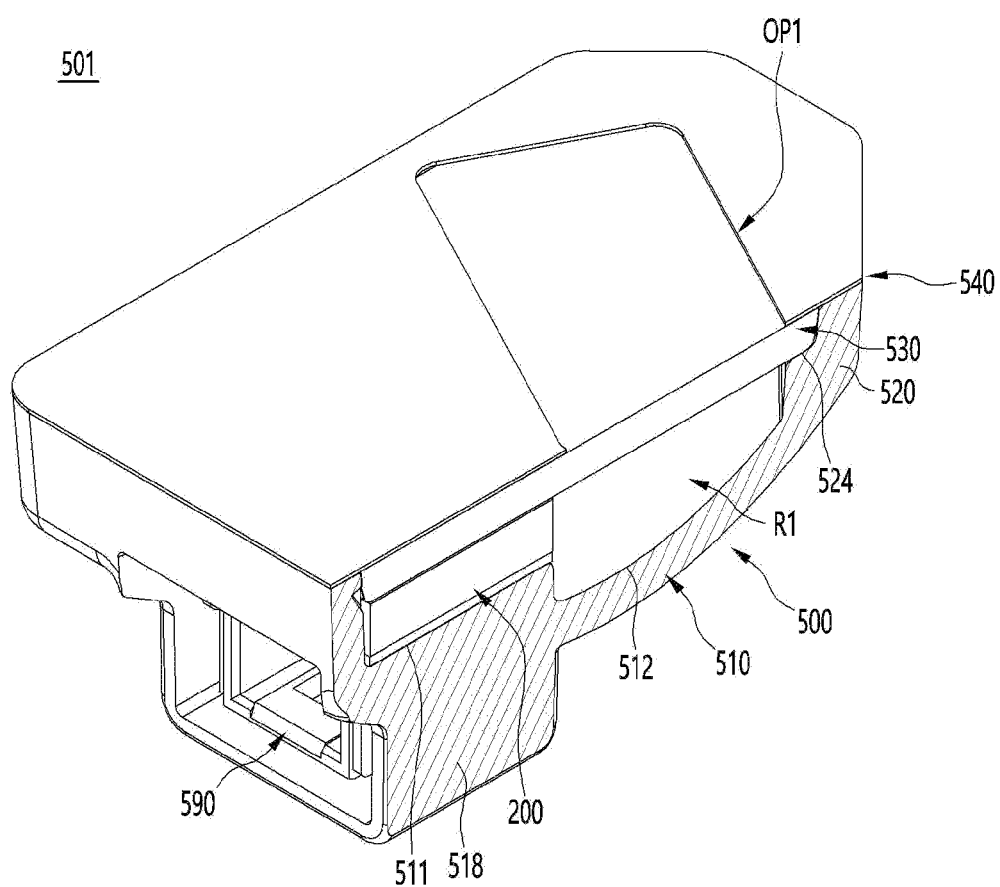
FIG. 13 is a partial side cross-sectional view of the optical assembly of FIG. 6.

FIGS. 1 and 2 are a side cross-sectional view conceptually showing an optical assembly according to an embodiment of the invention and a view viewed from the B-B side thereof, FIG. 3 is a side cross-sectional view illustrating an example of a lighting module of the optical assembly of FIG. 1, FIG. 4 is a view illustrating a housing, a lighting module, and a transparent cover of an optical assembly according to an embodiment of the invention, FIG. 5 is an example in which a light blocking member having an opening portion is stacked in the optical assembly of FIG. 4, FIG. 6 is an example of a front view of the optical assembly of FIG. 5, FIG. 7 is an example of an exploded perspective view of the optical assembly of FIG. 6, FIG. 8 is a perspective view in which the lighting module is coupled to the housing in the optical assembly of FIG. 6, FIG. 9 is a perspective view of a substrate on which a light emitting device and components are mounted in the lighting module of FIG. 4, FIG. 10 is a perspective view in which a transparent cover is coupled to the housing in FIG. 7, FIG. 11 is an example of a cross-sectional view taken along the B-B side of the optical assembly of FIG. 6, FIG. 12(A)(B) are views illustrating a reflective path in the concave reflective portion of the housing of the optical assembly of FIG. 8, and FIG. 13 is a partial side cross-sectional view of the optical assembly of FIG. 6.

Referring to FIGS. 1 and 2, the optical assembly 501 is coupled to side mirrors or rear-view mirrors coupled to the left and right sides of the moving object, and may notify the driver of a moving object, for example, a vehicle, along with visual information, of an alarm regarding whether an object is located on the side or rear side through identification information of an indicator or an icon. Here, the object may be a moving body or a floating body. The side mirror or the rear-view mirror may be rotated, accommodated, or protrude from the left and right sides of the moving object.

The optical assembly 501 may include a lighting module 200, a first receiving portion R2 in which the lighting module 200 is accommodated, and a reflective portion 510 having a recess R1 for reflecting the surface light emitted from the lighting module 200. A transparent cover 530 for transmits light may be disposed on the lighting module 200 and/or the reflective portion 510. A light blocking member 540 having an opening portion OP1 may be disposed on the transparent cover 530. The lighting module 200 generates and emits surface light, and the emitted surface light may be reflected to a set region A1 or a condensing region by the reflective portion 510. Here, the set region A1 or the condensing region may be the driver's direction of the moving object. The lighting module 200 has a light emitting device 100 and diffuses the light generated from the light emitting device 100 to emit light as a surface light. In this case, a width or height of the exit surface S1 emitted by the surface light may be 4 mm or less, that is, a line width of 4 mm or less. Accordingly, the surface light may be provided in the form of a linear surface light having a width of the exit surface S1. In FIG. 2, a length Y1 of the exit surface S1 of the lighting module 200 is the maximum, and may be greater than the length of the opposite side surface.

As shown in FIG. 1, the recess R1 of the reflective portion 510 may have a deeper depth as it is adjacent to the exit surface S1 of the lighting module 200, and a smaller depth as it moves away from the lighting module 200. A surface 512 of the reflective portion 510 or a bottom surface of the recess R1 may include a curved surface. The surface 512 of the reflective portion 510 or the bottom surface of the recess R1 may have an aspherical surface or a free-form surface shape. The curved surface of the reflective portion 510 may be disposed in a region lower than a horizontal extension line with a support portion 511 on which the lighting module 200 is disposed, and may reflect incident light in the direction of the transparent cover 530.

FIG. 2 is a B-B side view viewed from the inner sidewall 515 close to the exit surface S1 of the lighting module 200 in FIG. 1, and the inner sidewall 515 may have the lowest lower end K11 on one side, and may gradually increase or extend in a curved shape toward the other side K12. The inner sidewall 515 is gradually disposed to a deeper depth from the other side K12 to the lower end K11 along the lower end of the inner sidewall 515, so that the reflection angle on the curved surface of the reflective portion 510 extending to the lower end of the inner sidewall 515 may be adjusted. Here, the deepest low point K1 of the recess R1 may be a bottom point of the recess R1 with respect to the optical axis of the light emitting device 100. That is, the curved surface of the reflective portion 510 has a lower end K11 adjacent to one end of the exit surface S1 of the lighting module 200 based on the low point K1 and may be provided as a curved surface extending in a curved shape to the other upper end K12 adjacent to the other end of the exit surface S1.

The surface light reflected by the reflective portion 510 may be transmitted through the transparent cover 530. Since the reflective portion 510 has an aspherical surface, the optical assembly 501 may secure uniformity of light in the set region A1 and provide a required luminance (e.g., 6000 nit) or more. Here, the reflectance of the reflective portion 510 may include a material of 50% or more, and the reflection characteristic may be irradiated with optical characteristics of a Gaussian type or a mirror reflection type. The light blocking member 540 may include an opening OP1 that partially transmits light. The light blocking member 540 may be attached to the transparent cover 530 or attached to the rear surface of the rear-view mirror. The light blocking member 540 may be a part of the optical assembly 501 or a part of the rear-view assembly, but is not limited thereto.

The light blocking member 540 may include at least one of a binder resin, a photo initiator, a black pigment, and a solvent. For example, the binder resin may include an epoxy resin, an acrylic resin, a polyimide resin, a panel resin, a silicone resin, or a cardo-based resin material. The light blocking member 540 may be made of a resin-based or epoxy-based black material, and may include a light-blocking, reflective, or absorptive additive therein. The light blocking member 540 may include a high refractive inorganic spray, for example, it may include one or more selected from $TiO_2$ sol, $SrTiO_3$ sol, ZnS, ZnSe, potassium bromide, AgCl, MgO, cesium iodide, cesium bromide, $CaCO_3$, phosphorus tribromide, phenyl trichloride, trichroman-4-one, thionyl bromide, $ZnO_2$, $CeO_2$, ITO sol, $Ta_2O_5$, $Ti_2O_5$, $Ti_2O_3$, $ZrO_2$, $Br_2$, $CS_2$, $ZrO_2$—$TiO_2$-based sol and $SiO_2$—$Fe_2O_3$-based compounds. The light blocking member 540 may include a light absorbing material or a heat absorbing or heat dissipating material.

The lighting module 200 is disposed on a support portion 511, and the support portion 511 may have a flat or planar. The lighting module 200 has a light emitting device 100 therein, and the light emitted from the light emitting device 100 is emitted as a surface light through the exit surface S1. The thickness of the lighting module 200 is the maximum distance from the lower surface to the upper surface, and may be provided in a range of 5 mm or less, for example, 3 mm to 5 mm.

As shown in FIGS. 1 and 3, the lighting module 200 may include a substrate 210, at least one light emitting device 100 on the substrate 210, and a resin layer 220 covering the substrate 210 and the light emitting device 100. The lighting module 200 may further include a first reflective member 240 on the upper surface of the resin layer 220 and/or a second reflective member 230 between the substrate 210 and the resin layer 220. The second reflective member 230 may be disposed on the substrate 210 and may be disposed under the resin layer 220. The first and second reflective members 240 and 230 may reflect the incident light in the direction of the exit surface S1.

The substrate 210 includes a printed circuit board (PCB), for example, may include a resin-based printed circuit board (PCB), a metal core PCB, a flexible PCB, and a ceramic PCB, or a FR-4 substrate. The substrate 210 may be a flexible or non-flexible substrate. A circuit pattern may be disposed on the substrate 210. The circuit pattern of the substrate 210 may include a plurality of pads (e.g., 213) in a region corresponding to the light emitting device 100. The light emitting device 100 may be electrically connected to the substrate 210 through a bonding member 217. The light emitting device 100 may have a bonding portion disposed thereunder, and the bonding portion may be electrically connected to the pad of the substrate 210. When there are a plurality of the light emitting devices 100, they may be connected to each other in series or in parallel. The thickness of the substrate 210 may be smaller than the thickness of the light emitting device 100.

The light emitting device 100 emits light through one surface, and the one surface through which the light is emitted may be defined as a light emitting surface S2 or one side surface. The light emitting surface S2 of the light emitting device 100 may be adjacent to the substrate 210 and may be a side surface disposed in a direction perpendicular to the upper surface of the substrate 210. The light emitting surface S2 is disposed on a side surface between the bottom and the upper surface of the light emitting device 100, and light is emitted to the exit surface S1 of the resin layer 220 through the light emitting surface S2. The light emitting surface S2 of the light emitting device 100 may be adjacent to the second reflective member 230 and may be a surface perpendicular to the upper surface of the substrate 210 and the upper surface of the second reflective member 230. The thickness of the light emitting device 100 may be smaller than the length of one side (e.g., the long side length) of the light emitting device 100. The thickness of the light emitting device 100 may be 2.5 mm or less, for example, 2 mm or less. For example, the thickness of the light emitting device 100 may be in the range of 0.8 mm to 2 mm, for example, may be in the range of 1 mm to 1.8 mm. The thickness of the light emitting device 100 may be 2 times or greater of the thickness of the substrate 210, for example, may be in the range of 2 times to 4 times. The height Z0 of the upper surface of the light emitting device 100 may be lower than the upper surface of the resin layer 220. Since the substrate 210 is provided with a thin thickness, the lighting module 200 may be provided as a flexible plate.

The light emitting device 100 may include a device including an LED chip or a package in which the LED chip is packaged. For example, in the light emitting device 100, a light emitting chip 71, that is, an LED chip, may be disposed and packaged in the cavity 20, and an open region of the cavity 20 may become the light emitting surface S2. The light emitting chip may emit at least one of blue, red, green, and ultraviolet (UV) light. The light emitting device 100 may emit at least one of white, blue, red, and green. The light emitting device 100 may emit light in a lateral direction, and the substrate 210 may be disposed on the support portion 511. For example, the light emitting device 100 may be a side view type package or a package having one side of the light emitting surface S2. As another example, the light emitting device 100 may be an LED chip, and one surface of the LED chip may be opened and a reflective member may be disposed on the other surface. Alternatively, an LED chip may be disposed on the substrate 210, and light may be emitted through an upper surface and side surfaces of the LED chip.

The resin layer 220 may be made of a light-transmitting material such as silicone or epoxy. The resin layer 220 may include a glass material as another material. The resin layer 220 may be a layer having no impurities or may include impurities such as a diffusion agent. The resin layer 220 may include at least one of a silicone-based material, a silicone molding compound (SMC), an epoxy-based material, and an epoxy molding compound (EMC). The resin layer 220 may include a UV (ultra violet) curable resin or a thermosetting resin material, for example, may selectively include PC, OPS, PMMA, PVC, and the like. For example, the main material of the resin layer 220 may be a resin material having a urethane acrylate oligomer as a main material. For example, a mixture of urethane acrylate oligomer, which is a synthetic oligomer, and a polymer type, which is poly-acrylic, may be used. Of course, the main material may further include a monomer mixed with low-boiling dilution-type reactive monomers such as IB OA (isobornyl acrylate), HPA (hydroxyl propyl acrylate), 2-HEA (2-hydroxyethyl acrylate), etc., as an additive, a photo initiator (for example, 1-hydroxycyclohexyl phenyl-ketone, etc.) or antioxidants may be mixed.

A bead (not shown) may be included in the resin layer 220, and the bead may diffuse and reflect incident light to increase the amount of light. The resin layer 220 may include a phosphor. The phosphor may include at least one of yellow, green, blue, and red phosphors.

The width or height of the exit surface S1 of the resin layer 220 may be 4 mm or less, for example, 3 mm or less, or may be provided with a width of more than 1 time and less than 2 times the thickness of the light emitting device 100. The thickness Z1 of the resin layer 220 may be, for example, 3 mm or less, for example, in the range of 1.5 mm to 3 mm, or in the range of 1.6 mm to 2.5 mm. The resin layer 220 may be formed on the substrate 210 with a constant thickness Z1. The lighting module 200 emits surface light having a narrow line width, so that it may be incident on the reflective portion 510 with a uniform luminance distribution, and the reflective portion 510 may be reflected and condensed to a region set by a curved surface convex toward the bottom. The upper surface area of the resin layer 220 may be the same as the upper surface area of the substrate 210. The upper surface area of the resin layer 220 may be the same as the upper surface area of the second reflective member 230 and/or the upper surface area of the first reflective member 240. As shown in FIGS. 7 and 8, the length D2 at the first side surface Sa1 of the lighting module 200 may be greater than the length D3 at the second side surface Sb1 opposite to the first side surface Sa1. The first side surface Sa1 and the second side surface Sb1 may be surfaces extending from both ends of the exit surface S1. The distance between the first side surface Sa1 and the second side surface Sb1 is the length of the exit surface S1 and may be greater than the lengths D2 and D3. The light emitting surface S2 and the exit surface 51 may be disposed parallel to each other. For example, a straight line extending in the length direction of the light emitting surface S2 and a straight line extending in the length direction of the exit surface 51 may be parallel to each other. Accordingly, light emitted through the light emitting device 100 and traveling along the optical axis may be transmitted without being reflected from the exit surface S1.

The resin layer 220 may be disposed between the first and second reflective members 240 and 230. The upper surface of the second reflective member 230 and the lower surface of the first reflective member 240 may face each other on the lower surface and the upper surface of the resin layer 220. The upper surface of the first reflective member 240 and the lower surface of the second reflective member 230 may have the same area. Accordingly, the resin layer 220 may diffuse the light emitted from the light emitting device 100 and the light reflected by the first and second reflective members 240 and 230 to guide them in the lateral direction.

Since the resin layer 220 is formed to have a thickness greater than that of the light emitting device 100, it is possible to protect the upper portion of the light emitting device 100 and suppress moisture penetration. Accordingly, the interval Z4 between the upper surface of the resin layer 220 and the light emitting device 100 may be 0.6 mm or less, for example, in the range of 0.3 mm to 0.6 mm. The thickness Z1 of the resin layer 220 is a distance between the first and second reflective members 240 and 230, and the distance (e.g., Z1) between the first and second reflective members 240 and 230 may be less than a distance between two opposing sides of the resin layer 220. The distance or interval between the second reflective member 230 and the first reflective member 240 is arranged to be smaller than the width or height of the lighting module 200, thereby providing a line-shaped surface light from the lighting module 200 and improving brightness and preventing hot spots. The second reflective member 230 may reflect the light emitted from the light emitting device 100. The second reflective member 230 may be formed on the upper surface of the substrate 210. The second reflective member 230 may be formed as an upper layer of the substrate 210 or as a separate layer. The second reflective member 230 may be adhered to the upper surface of the substrate 210 with an adhesive. The resin layer 220 may be formed on the upper surface of the second reflective member 230. The second reflective member 230 has an opening 232 in a region corresponding to the lower surface of the light emitting device 100, and the light emitting device 100 may be connected to the substrate 210 through the opening 232. A portion of the first resin layer 220 may be in contact with the substrate 210 through the opening 232. The opening 232 may be a region in which the light emitting device 100 is bonded to the substrate 210. The second reflective member 230 may be formed in a single-layer or multi-layer structure. The second reflective member 230 may include a material that reflects light, for example, a metal or a non-metal material. When the second reflective member 230 is a metal, it may include a metal layer such as stainless steel, aluminum (Al), or silver (Ag), and in the case of a non-metallic material, it may include a white resin material or a plastic material. The second reflective member 230 may include a white resin material or a polyester (PET) material. The second reflective member 230 may include at least one of a low reflection film, a high reflection film, a diffuse reflection film, and a regular reflection film. The second reflective member 230 may be provided as, for example, a specular reflective film for reflecting incident light. The second reflective member 230 may include a dot pattern thereon. One side of the second reflective member 230 may be disposed on the same plane as one side of the resin layer 220. As another example, the resin layer 220 may be disposed at the end of the second reflective member 230 to prevent moisture from penetrating from the outside.

A thickness of the second reflective member 230 may be smaller than a thickness of the substrate 210. The thickness of the second reflective member 230 may be 0.5 times or more of the thickness of the substrate 210 to reduce transmission loss of incident light. The thickness of the second reflective member 230 may be in the range of 0.2 mm to 0.4 mm, and when it is smaller than the range, light transmission loss may occur, and when it is thicker than the range, the thickness of the lighting module 200 may increase. A thickness of the first reflective member 240 may be smaller than a thickness of the substrate 210. The thickness of the first reflective member 240 is disposed to be 0.5 times or more of the thickness of the substrate 210, thereby reducing transmission loss of incident light. The thickness of the first reflective member 240 may be in the range of 0.2 mm to 0.4 mm, and when it is smaller than the above range, light transmission loss may occur, and when it is thicker than the above range, the thickness of the lighting module 200 may increase. The first reflective member 240 may be disposed on the entire upper surface of the resin layer 220 to reduce light loss. The first reflective member 240 may be made of the same material as the second reflective member 230. In order to reflect light and reduce transmission loss of light, the first reflective member 240 may be made of a material having a higher light reflectance than that of the second reflective member 230 or may have a thicker thickness. The first reflective member 240 may have the same thickness as the second reflective member 230 or a thicker thickness. For example, the first and second reflective members 240 and 230 may be provided with the same material and the same thickness. The first reflective member 240 may be formed in a single-layer or multi-layer structure. The first reflective member 240 may include a material that reflects light, for example, a metal or a non-metal material. When the first reflective member 240 is a metal, it may include a metal layer such as stainless steel, aluminum (Al), or silver (Ag), and in the case of a non-metallic material, it may include a white resin material or a plastic material. The first reflective member 240 may include a white resin material or a polyester (PET) material. The first reflective member 240 may include at least one of a low reflection film, a high reflection film, a diffuse reflection film, and a regular reflection film. The first reflective member 240 may be, for example, provided as a regular reflective film so that the incident light travels in the direction of the first surface S1.

Here, a light extraction structure such as a concave-convex structure may be disposed on the exit surface S1 of the resin layer 220. Accordingly, the extraction efficiency of light emitted through the resin layer 220 may be improved. The exit surface 51 may be treated as a haze surface, so that light may be diffused. The haze surface may be treated to be rougher than the other surfaces Sa1 and Sb1 of the resin layer 220 to diffuse the emitted light. The lighting module 200 according to an embodiment of the invention may provide a line-shaped surface light source having flexibility by providing the thickness in the height direction in the form of a line.

As shown in FIGS. 1 and 2, the support portion 511 and the reflective portion 510 may be connected to each other by an inner sidewall 515. The maximum height h1 of the inner sidewall 515 may be 0.5 cm or less, for example, may be in the range of 0.4 cm to 0.5 cm. A layer of a reflective material may be formed on the surface of the inner sidewall 515. The recess R1 of the reflective portion 510 may include a curved surface convex toward the bottom. The surface of the reflective portion 510 may be a mirror surface having an aspherical shape or a reflection layer may be formed thereon. Curved surfaces having different curvatures may be connected to the surface of the reflective portion 510 to form the shape of the inner surface of the reflective portion 510. The reflective layer may be formed of a metal such as aluminum, silver, gold, copper, or an optional alloy thereof. An outer sidewall 520 extends from an upper end of the reflective portion 510, and the outer sidewall 520 may face the exit surface S1 of the lighting module 200. A layer of a reflective material may be formed on the inner surface of the outer sidewall 520. The outer sidewall 520 may extend in a vertical direction from the upper end of the reflective portion 510, or may have a concave or/convex inner surface and may extend in a vertical direction. Here, the vertical direction may be a direction perpendicular to the direction of the optical axis emitted from the light emitting device 100 or a direction from the lower surface of the lighting module 200 to the upper surface. The outer sidewall 520 may be disposed on the upper periphery of the reflective portion 510 and may be disposed on the upper periphery of the support portion 511. Accordingly, the outer sidewall 520 may cover the outside of the lighting module 200. The open region Ra between the outer sidewall 520 and the lighting module 200 may be an upper region of the recess R1, or may be a region connected to the receiving portion R2. The curved upper end K2 of the reflective portion 510 may be disposed equal to or lower than a straight line extending from the lower surface of the support portion 511 or the lighting module 200. Also, the exit surface S1 may be disposed higher than the curved upper end K2 of the reflective portion 510.

When a first boundary portion or a curved lower end is defined between the lower end of the reflective portion 510 and the lower end K1 of the inner sidewall 515, and a second boundary portion is defined between the curved upper end K2 of the reflective portion 510 and the lower end of the outer sidewall 520, the curved surface of the reflective portion 510 may be higher in a region farther from the first boundary portion, and a distance between the curved surface of the reflective portion 510 and the inner sidewall 515 may increase in an upward direction. With respect to the straight line X1 extending horizontally based on the first boundary portion, an angle Q1 between the virtual straight line V1 passing through the curved lower end K1 and the curved upper end K2 is 50 degrees or less, for example, may be 45 degrees or less, and an angle Q2 between the straight line V1 and the inner sidewall 515 may be 60 degrees or less, for example, may be in the range of 10 degrees to 60 degrees. An angle Q1+Q2 between the straight line V1 and the inner sidewall 515 may be less than or equal to 90 degrees, so that the inner sidewall 515 may be provided as an inclined surface. In the structure shown in FIG. 1, a first inclination of the straight line V1 connecting both ends of the curved surface of the reflective portion 510 may be smaller than the second inclination of a straight line connecting both ends of the curved surface of the reflective portion 520 in the structure shown in FIG. 2. That is, the curved surface of the reflective portion 510 gradually increases in a height from the lower end of one side to the lower end of the other side of the exit surface S1, and may have a gradually higher height as it moves away from the exit surface S1 with respect to the lower end of one side and the lower end of the other side of the exit surface S1. Here, the lower end of one side of the exit surface S1 may be a curved lower end adjacent to the first side surface Sa1, and the lower end of the other side may be a curved lower end adjacent to the second side surface Sb1.

As shown in FIGS. 4 to 7, the optical assembly 501 may be provided with a housing 500 having a support portion 511 and a reflective portion 510. The support portion 511 of the housing 500 may be disposed on the bottom of the receiving portion, and the reflective portion 510 may have a recess R1 and be disposed below the exit side of the lighting module 200. The outer sidewall 520 may be disposed around the upper portion of the housing 500 to block light travelling to the upper portion of the reflective portion 510 and cover the outside of the lighting module 200. The housing 500 may include the support portion 511 having a receiving portion R1 in one region and a reflective portion 520 having a recess R2 in the other region. The exit surface S1 of the lighting module 200 may be exposed toward the recess R1. The opening portion OP1 of the light blocking member 540 may overlap a partial region of the recess R1.

A distance h2 between the curved upper end K2 of the reflective portion 510 and the transparent cover 530 may be equal to or smaller than the thickness of the lighting module 200. Accordingly, the transparent cover 530 may press the lighting module 200 in the direction of the support portion

511. The upper surface of the support portion 511 or the bottom of the receiving portion R1 may be a horizontal plane. The upper surface of the support portion 511 and the lower surface of the lighting module 200 may be disposed parallel to each other. As another example, the lighting module 200 may be provided in an inclined structure having a lower depth toward the exit surface S1. The material of the housing 500 is a resin material, for example, may include at least one material of plastic, polypropylene (PP), polyethylene (PE), polycarbonate (PC), PBT (Polybutylene Terephthalate), ABS (Acrylonitrile Butadiene Styrene copolymer), POM (Poly Oxy Methylene), Polyacetal), PPO (Polyphenylene Oxide) resin, and a modified PPO (Modified PPO) resin. In addition, the housing 500 may include at least one of silver (Ag), copper (Cu), titanium (Ti), magnesium (Mg), chromium (Cr), molybdenum (Mo), nickel (Ni), aluminum (Al), stainless steel and an alloy including the same. As shown in FIG. 7, a shape of the bottom of the support portion 511 may be the same as the shape of the bottom surface of the lighting module 200. A hole 519 into which the connector 590 is inserted may be provided in the support portion 511. The connector 590 may be electrically connected to the substrate 210 of the lighting module 200.

The exit surface S1 of the lighting module 200 may be disposed on the same vertical plane as the upper end K3 of the inner sidewall 515 or may further protrude. As another example, the upper end of the exit surface 51 may protrude more than the lower end, thereby improving light output efficiency in the direction of the reflective portion 510. The upper end K3 of the inner sidewall 515 is disposed equal to or higher than the upper end K2 of the reflective portion 510, thereby reducing leakage or loss of light emitted through the exit surface S1. The transparent cover 530 may extend from an upper portion of the lighting module 200 to an upper portion of the recess R1. The transparent cover 530 may be selectively formed of a transparent material, for example, PC, OPS, PMMA, PVC, or the like. The transparent cover 530 may adhere or press the lighting module 200 on the support portion 511. A portion of the transparent cover 530 is disposed on the step portion 524 disposed on the outer sidewall 520 of the housing 500, and the step portion 524 may be disposed around the upper periphery of the recess R1. The upper surface of the step portion 524 may be disposed on the same straight line as the upper surface of the lighting module 200, and the lower surface of the transparent cover 530 may be supported on the upper surface of the lighting module 200. The lower surface of the lighting module 200 may be adhered to the support portion 511 with an adhesive layer, and the adhesive layer is a transparent material, and may be an adhesive such as UV adhesive, silicone, or epoxy. An upper flow of the lighting module 200 may be blocked by the transparent cover 530, and a horizontal flow may be blocked by an adhesive or other mechanism. A portion of the transparent cover 530 may include a protrusion 533 coupled to the groove 525 of the outer sidewall 521 on the side of the receiving portion R2, but is not limited thereto.

The transparent cover 530 is disposed in a plane perpendicular to the exit surface S1 of the lighting module 200, so that when the surface light emitted through the exit surface S1 of the lighting module 200 is incident, it may be diffused or refracted in a different direction.

The transparent cover 530 may have a light-blocking coating layer on the upper surface and/or the lower surface, or may emit light through the open region OP2 corresponding to the upper portion of the recess R1. As shown in FIG. 5, when the light blocking member 540 is disposed on the transparent cover 530, the transparent cover 530 may be made of a material that transmits or diffuses light. The transparent cover 530 may have a rough surface and may be processed so that the hot spots are not visible from the outside. As shown in FIGS. 6 and 7, the light blocking member 540 emits the light emitted through the transparent cover 530 through the opening portion OP1, and the light emitted through the opening portion OP1 may function as an indicator. At least one indicator or a plurality of indicators may be disposed, and when a plurality of indicators is disposed, the indicators may be the same or different from each other. The indicator may be formed of at least one of a logo, an icon, a symbol, and a mark shape for identification. The indicator will be described in detail with reference to FIG. 15, which will be described later.

As shown in FIGS. 4 and 8, the lighting module 200 may have different lengths D2 and D3 in the direction in which light is emitted (e.g., X). The lengths D2 and D3 may be smaller than the length D1 of the transparent cover 530, and the minimum length D3 in one direction (e.g., X) is the length of the second side surface Sb1, and may be 50% or less of the maximum length D1 of the transparent cover 530. The maximum length D2 in one direction (e.g., X) may be greater than 50% of the maximum length D1 of the transparent cover 530. The maximum length direction of the transparent cover 530 may be the same as the optical axis direction having the highest central luminous intensity among the light emitted from the light emitting device 100.

Figure 12B:
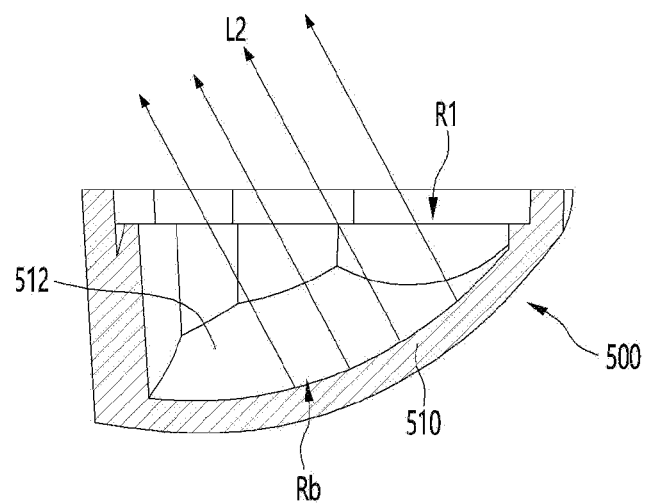

The lengths D2 and D3 in one direction of the lighting module 200 may be the largest at the driver's side and the lowest at the object side. Accordingly, the exit surface S1 of the lighting module 200 may be inclined at a predetermined angle Q3 from a region adjacent to the first side surface Sa1 to a region adjacent to the second side surface Sb1. The angle Q3 is an angle between the horizontal virtual straight line and the extension line Lb of the inclined exit surface S1, and may be in the range of 60 degrees or less, for example, 10 degrees to 60 degrees or 20 degrees to 50 degrees, when it is larger than the above range, the region of the recess R1 may be reduced, and when it is smaller than the above range, a difference in the amount of reflected light may occur. Here, at the bottom of the reflective portion 510, the first region Ra is surface-treated to reflect incident light in the vertical direction, as shown in FIG. 12(A), and the second region Rb may be surface-treated to reflect to the region set as shown in FIG. 12(B). For example, the first region Ra overlapping the opening portion OP1 in the vertical direction may reflect light in the vertical direction. In addition, light may be reflected toward the opening portion OP1 or toward the driver's side in the second region Rb that does not overlap or partially overlap the opening portion OP1 in the vertical direction. Accordingly, reduction in luminance of the light emitted through the opening portion OP1 may be suppressed, and light having a higher luminance value may be provided to the driver. Accordingly, the driver may more effectively visually recognize the indicator.

In addition, the light emitting device 100 may be tilted at a predetermined angle Q5 based on a virtual straight line extending to the rear surface, and the tilt angle Q5 may in a range of 60 degrees or less, for example, 10 degrees to 60 degrees or 20 to 50 degrees. Light emitted through the tilted light emitting device 100 may be emitted with the highest luminous intensity toward the second region Rb, and the light reflected from the second region Rb of the reflective portion 510 may be seen as the highest luminance value in directed toward the driver.

As shown in FIG. 9, the light emitting device 100 may be tilted and disposed on the substrate of the lighting module 200, and a light directivity angle R10 emitted from the tilted light emitting device 100 may be in a range of 100 degrees or more, for example, 105 degrees to 140 degrees. In this case, the other component 105 disposed on the substrate 210 may be disposed in a region out of the light directivity angle R10. That is, in consideration of the directivity characteristics of the light emitting device, the components 105 may be disposed in a region that does not interfere with the light emitted from the light emitting device. This is because the lower surface of the substrate 210 is disposed in close contact with the support portion 511 of the housing 500, so it is not possible to install components on the lower surface of the substrate, so that the components 105 on the upper portion of the substrate 210 may be disposed in a region outside the light directivity angle R10.

As shown in FIG. 10, a transparent cover 530 may be disposed on the upper portion of the housing 500. The transparent cover 530 may be disposed to have a long length in a direction from the first outer surface S21 to the second outer surface S22. The maximum length X0 of the housing 500 may be in the range of 1.2 cm or more, for example, 1.2 cm to 1.7 cm, and the maximum width Y0 of the housing 500 may be in the range of 0.8 cm or more, for example, 0.8 cm to 1.5 cm, and the size of the housing 500 is not limited thereto. The size of the housing 500 may vary depending on a space to be mounted or a lighting target.

As shown in FIG. 13, a light blocking member 540 may be disposed on upper surfaces of the transparent cover 530 and the housing 500. The light blocking member 540 may be adhered to the upper surface of the housing 500 of the optical assembly 501 or may be adhered to the rear-view mirror. Also, the indicator may be formed in at least one of the rear-view mirror and the light blocking member 540.

Figure 14:
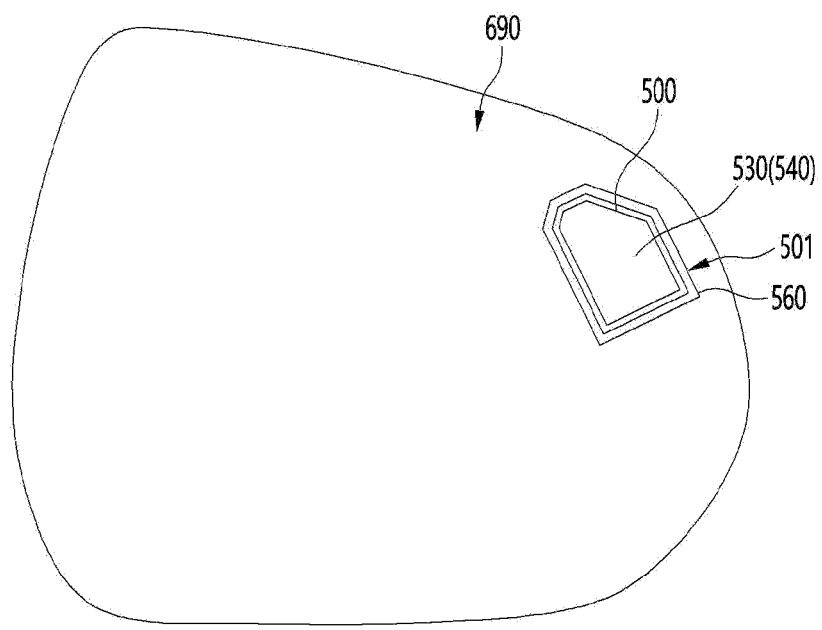
FIG. 14 is a front view of the back plate in the assembly of the rear-view mirror to which the optical assembly of FIG. 6 or 10 is coupled.
Figure 15:
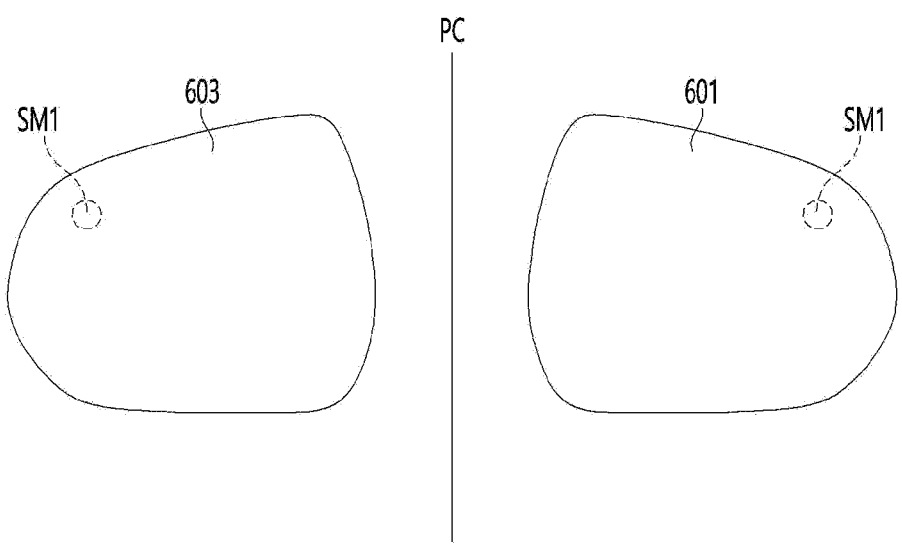
FIG. 15 is an example of left/right rear-view mirrors disposed on a moving object according to an embodiment of the invention.
Figure 16:
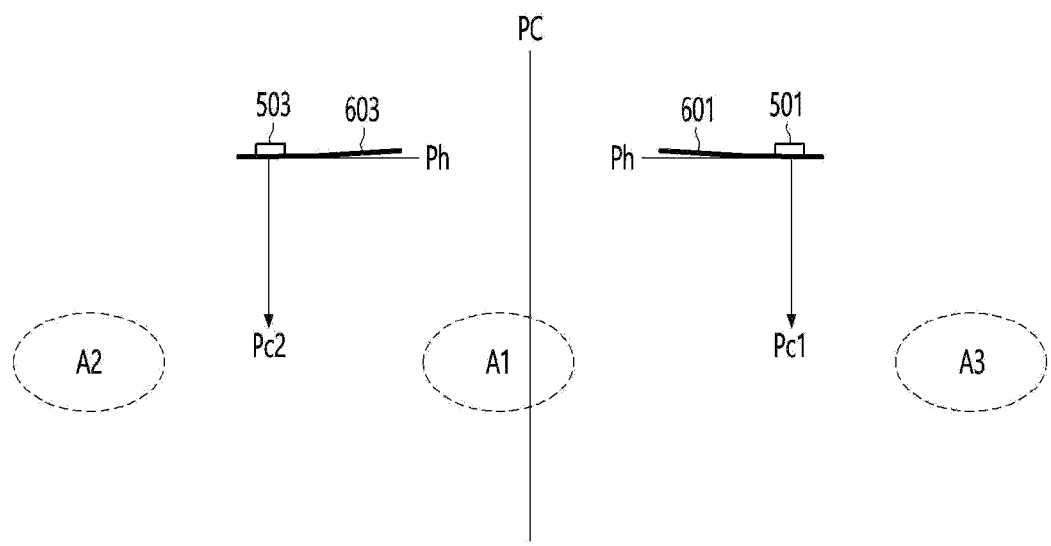
FIG. 16 is a diagram for explaining the intensity of a luminance value in left/right rear-view mirrors disposed on a moving object according to an embodiment of the invention.

As shown in FIGS. 14 to 16, the optical assembly 501 may be coupled to the receiving space 560 of the back plate 690 disposed on the rear surface of the rear-view mirror. Here, the rear-view mirror may be a right-side mirror with respect to the driver, and the optical assembly 501 may be disposed outside the center of the back plate 690 to detect and alert an external object.

An assembly to which the left/right rear-view mirrors 601 and 603 of a moving object, for example, of a vehicle are coupled, may include the above-described optical assemblies 501 and 503, respectively. Since the rear-view mirror assemblies 601 and 603 are symmetrical to each other in the same shape, an example in which the optical assembly is applied in the right rear-view mirror assembly has been described.

As shown in FIG. 15, the indicator SM1 is exposed through the rear-view mirror on the left/right on the basis of the virtual straight line PC on which the driver is placed, or the indicator SM1 may be displayed when the lighting module 200 is driven. The indicator SM1 may be formed in at least one of a logo, an icon, a symbol, and a mark for identification, and may be formed on a region of at least one of the rear-view mirrors 601 and 603 and the light blocking member 540. For example, the indicator SM1 may be formed on the rear-view mirrors 601 and 603, and may be disposed in a region overlapping the opening portion OP1 of the light blocking member 540 among the rear-view mirrors 601 and 603. Alternatively, the indicator SM1 may be formed in the light blocking member 540 and may be formed in the opening portion OP1 of the light blocking member 540. The indicator SM1 may vertically overlap the first region Ra of the reflective portion 510. Also, the indicator SM1 may not vertically overlap or partially overlap the second region Rb of the reflective portion 510. One or a plurality of indicators SM1 may be provided. For example, when a plurality of the indicators is provided, the first indicator may be disposed on the driver's side (the set region A1), and may be provided with a region larger than that of the second indicator. The second indicator may be disposed toward the outer side of the first indicator or toward the object-side regions A2 and A3, or may be disposed outside the lower portion of the first indicator. That is, the light emitted from the lighting module 200 may be reflected by the reflective portion 510 having an aspherical shape and pass through the opening portion OP1 of the light blocking member 540. In this process, the light emitted from the lighting module 200 may be provided as a surface light source and may pass through the indicator SM1 formed on the rear-view mirror and/or the light blocking member 540, and the indicator SM1 from the outside may be recognized. Accordingly, the rear-view mirror assembly may effectively provide information on the external object to the user. In addition, the light emitted from the lighting module 200 may be provided in various forms, such as a continuous alarm through the indicator SM1, a flashing form, or a form of gradually increasing or decreasing the luminance value.

Figure 17:
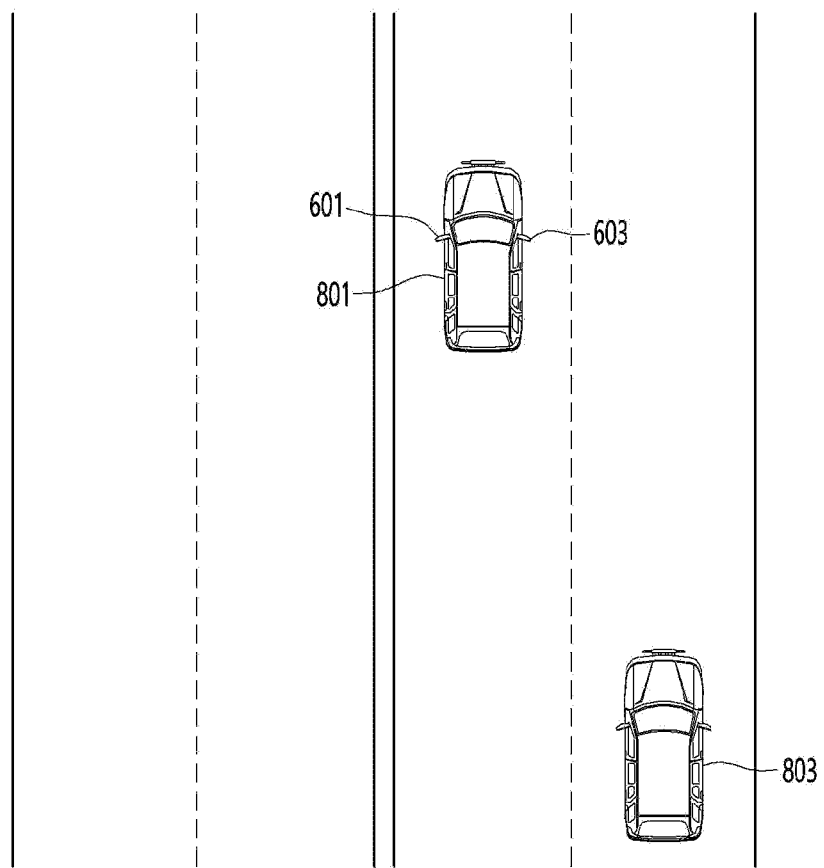
FIG. 17 is a view for explaining an alarm by left/right rear-view mirrors according to movement of a moving object according to an embodiment of the invention.

As shown in FIGS. 15 to 17, the left/right rear-view mirrors 601 and 603 of the moving object, for example, the vehicle 801 may include the optical assemblies 501 and 503 described above. Since the assemblies including the rear-view mirrors 601 and 603 are symmetrical to each other in the same shape, an example applied to the right rear-view mirror has been described for convenience of description. For example, when other moving object 803 or object is located on the left/right side of the vehicle with respect to the driver or vehicle 801, the light emitted from the lighting modules 200 of the optical assemblies 501 and 503 may be emitted from the rear-view mirror to the outside through an indicator. Accordingly, light emitted through the left/right rear-view mirror assembly may be emitted in a set direction, for example, a driver's direction, and may have different luminance values according to the exit direction.

In detail, when there is a virtual horizontal straight line Ph passing through the rear-view mirrors 601 and 603 located on the left or right, and straight lines Pc1 and Pc2 perpendicular to the horizontal straight line Ph, a luminance value of the first region A1 located in the inner direction than the straight lines Pc1 and Pc2, for example, the set region A1, may be different from luminance values of the second region A2 and the third region A3 located in the outer direction. In detail, the first region A1 may have a higher luminance value than the second region A2 and the third region A3. That is, in the embodiment, as the surface of the reflective portion 510 is formed as an aspherical surface, the luminance value according to the light exit direction may be controlled. For example, the luminance value of the light emitted to the first region A1, the second region A2, and the third region A3 may be controlled. Also, in each of the first to third regions A1, A2, and A3, a luminance value according to an exit direction may be controlled. In addition, as the surface of the reflective portion 510 is formed as an aspherical surface, each light emitted in the direction of the first to third regions A1, A2 and A3 passing through the opening portion OP1 may have uniform luminance. Accordingly, the embodiment may minimize light loss and effectively provide light of relatively high luminance to the driver of the moving object by controlling the luminance value according to the exit direction, and may be provide light of a relatively low luminance to other moving objects located on the rear side of the moving object.

Figure 18:
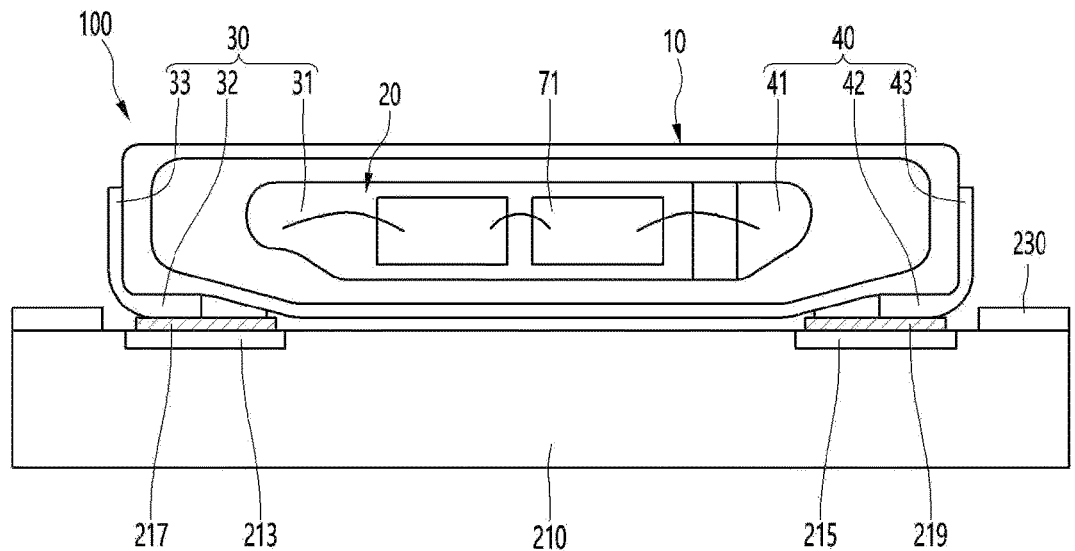
FIG. 18 is an example of a front view of a light emitting device of a lighting module according to an embodiment of the invention.
Figure 19:
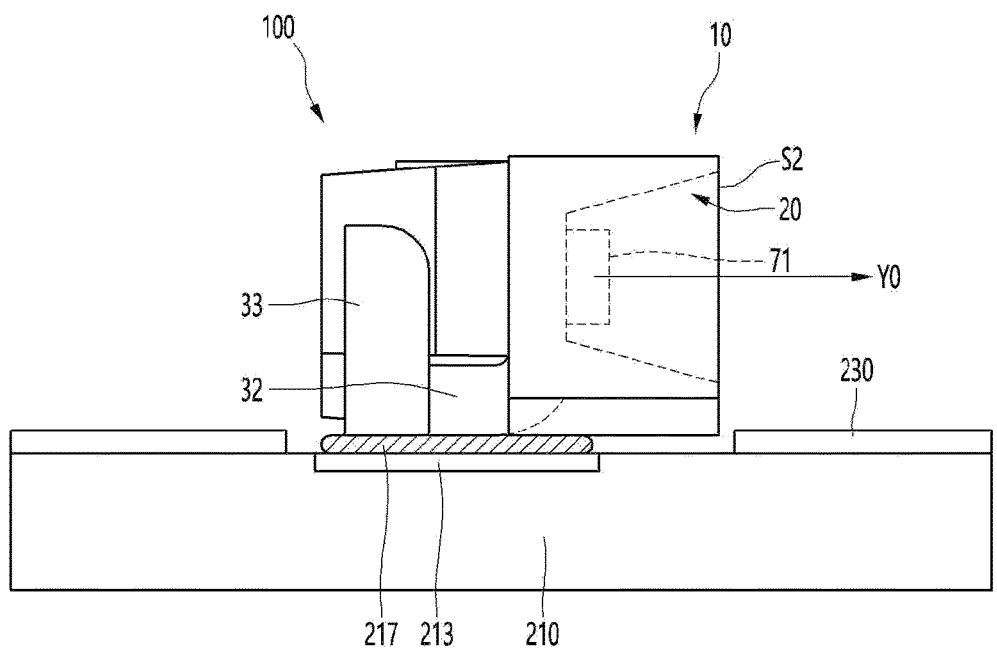
FIG. 19 is a perspective view of the light emitting device of FIG. 18 viewed from the side.

FIGS. 18 and 19 are a front view and a side view illustrating a light emitting device on a substrate in the lighting module 200. Referring to FIGS. 18 and 19, the light emitting device 100 includes a body 10 having a cavity 20, a plurality of lead frames 30 and 40 in the cavity 20, and a light emitting chip 71 disposed on at least one of a plurality of lead frames 30 and 40. The light emitting device 100 may be implemented as a side view type package. The body 10 may include a cavity 20 in which the lead frames 30 and 40 are exposed at the bottom. The plurality of lead frames 30 and 40 are separated into, for example, a first lead frame 30 and a second lead frame 40 and coupled to the body 10. The body 10 may be formed of an insulating material. The body 10 may be formed of a reflective material. The body 10 may be formed of a material having a reflectance higher than a transmittance for a wavelength emitted from the light emitting chip, for example, a material having a reflectance of 70% or more. When the reflectivity is 70% or more, the body 10 may be defined as a non-transmissive material or a reflective material. The body 10 may be formed of a resin-based insulating material, for example, a resin material such as polyphthalamide (PPA). The body 10 may be formed of a silicone-based, epoxy-based, or thermosetting resin including a plastic material, or a high heat and light resistance material. The body 10 may include a reflective material, for example, a resin material to which a metal oxide is added, and the metal oxide may include at least one of $TiO_2$, $SiO_2$, and $Al_2O_3$. The body 10 may effectively reflect incident light. As another example, the body 10 may be formed of a translucent resin material or a resin material having a phosphor for converting the wavelength of incident light. The bottom of the body 10 may be a side surface corresponding to the substrate 210. The first lead frame 30 includes a first lead part 31 disposed on the bottom of the cavity 20, a first bonding part 32 extending outside the body 10, and a first heat dissipation part 33. The first bonding part 32 may be bent from the first lead part 31 in the body 10 and protrudes outside the body, and the first heat dissipation part 33 may be bent from the first bonding part 32. The second lead frame 40 includes a second lead part 41 disposed on the bottom of the cavity 20, a second bonding part 42 and a second heat dissipation part 43 disposed on an outer region of the body 10. The second bonding part 42 may be bent from the second lead part 41 in the body 10, and the second heat dissipation part 43 may be bent from the second bonding part 42. Here, the light emitting chip 71 may be disposed on the first lead part 31 of the first lead frame 30, and may be connected to the first and second lead parts 31 and 41 with a wire or, may be connected to the first lead part 31 with an adhesive and connected to the second lead part 41 with a wire. The light emitting chip 71 may be a horizontal chip, a vertical chip, or a chip having a via structure. The light emitting chip 71 may be mounted in a flip chip method. The light emitting chip 71 may selectively emit light within a wavelength range of ultraviolet to visible light. The light emitting chip 71 may emit, for example, ultraviolet or blue peak wavelength. The light emitting chip 71 may include at least one of a group II-VI compound and a group III-V compound. The light emitting chip 71 may be formed of, for example, a compound selected from the group consisting of GaN, AlGaN, InGaN, AlInGaN, GaP, AlN, GaAs, AlGaAs, InP, and mixtures thereof. One or a plurality of light emitting chips 71 may be disposed in the cavity 20 and emit light with the greatest intensity in the direction of the central axis Y0. One or a plurality of light emitting chips disposed in the cavity 20 of the light emitting device 100 according to the embodiment may be disposed. The light emitting chip may be selected from, for example, a red LED chip, a blue LED chip, a green LED chip, and a yellow green LED chip.

A molding member 80 is disposed in the cavity 20 of the body 10, and the molding member 80 includes a light-transmitting resin such as silicone or epoxy, and may be formed in a single layer or in multiple layers. The molding member 80 or the light emitting chip 71 may include a phosphor for changing the wavelength of the emitted light, and the phosphor excites a part of the light emitted from the light emitting chip 71 to have a different wavelength. emitted as light. The phosphor may be selectively formed from quantum dots, YAG, TAG, silicate, nitride, and oxygen-nitride-based materials. The phosphor may include at least one of a red phosphor, a yellow phosphor, and a green phosphor, but is not limited thereto. The light emitting surface S2 of the molding member 80 may be formed in a flat shape, a concave shape, a convex shape, or the like, but is not limited thereto. As another example, a light-transmitting film having a phosphor may be disposed on the cavity 20, but the present disclosure is not limited thereto. A lens may be further formed on the upper portion of the body 10, and the lens may include a structure of a concave and/or convex lens, and may adjust the light distribution of the light emitted by the light emitting device 100. A semiconductor device such as a light receiving device and a protection device may be mounted on the body 10 or any one of the lead frames, and the protection device may be implemented as a thyristor, a Zener diode, or a TVS (Transient voltage suppression), and the Zener diode protects the light emitting chip from electrostatic discharge (ESD). At least one light emitting device 100 is disposed on the substrate 210, and a second reflective member 230 is disposed around a lower portion of the light emitting device 100. The first and second lead portions 33 and 43 of the light emitting device 100 are bonded to the pads 213 and 215 of the substrate 210 with solder or conductive tape as conductive adhesive members 217 and 219.

The optical assembly according to the embodiment of the invention may be applied as a lamp of a moving object or a vehicle lamp. The optical assembly may be applied to a lamp inside a vehicle or an exterior lamp. The lamp is an example of a vehicle lamp, such as a head lamp, a side lamp, a side mirror lamp, a fog lamp, a tail lamp, a brake lamp, a daytime running lamp, a vehicle interior lighting, a door scar, a rear combination lamp, or Applicable as an alarm device for backup lamps. Features, structures, effects, etc. described in the above embodiments are included in at least one embodiment of the invention, and are not necessarily limited to only one embodiment. Furthermore, features, structures, effects, etc. illustrated in each embodiment may be combined or modified for other embodiments by those of ordinary skill in the art to which the embodiments belong. Accordingly, the contents related to such combinations and modifications should be interpreted as being included in the scope of the invention.

The invention claimed is:
1. An optical assembly comprising:
   a lighting module including a substrate, a resin layer disposed on the substrate and a light emitting device inside the resin layer, and having an exit surface for emitting light on one side thereof;

a reflective portion having a recess in a lower portion of an exit side of the lighting module and an aspherical curved surface at a bottom of the recess; and a transparent cover over the recess, wherein the resin layer seals the light emitting device, wherein a length of the exit surface of the lighting module is greater than a length of a surface opposite to the exit surface, wherein a straight line extending along a length direction of the exit surface of the lighting module is inclined with respect to a straight line extending along a length direction of a surface opposite to the exit surface.

2. The optical assembly of claim 1, comprising:

a support portion having a receiving portion in which the lighting module is disposed;

an inner sidewall extending from the support portion to a lower end of the reflective portion; and an outer sidewall disposed around an upper portion of the reflective portion and the support portion, wherein the curved surface of the reflective portion has a gradually deeper depth as it is adjacent a lower end of one side of the exit surface.

3. The optical assembly of claim 2, wherein the curved surface of the reflective portion has a gradually higher height from the lower end of one side to a lower end of the other side of the exit surface.

4. The optical assembly of claim 2, wherein the lighting module includes:

a first reflective member on the resin layer; and a second reflective member between the resin layer and the substrate;

wherein the light emitting device is disposed on the substrate, wherein the exit surface is disposed parallel to a light emitting surface on which one side of the light emitting device is disposed, wherein the lighting module has a first and second side surfaces facing each other, wherein a length of the first side surface adjacent to one side of the resin layer is longer than a length of the second side surface opposite to the first side surface.

5. The optical assembly of claim 4, wherein a height of the exit surface of the lighting module is a same as a thickness of the resin layer in a vertical direction, wherein the thickness of the resin layer is 4 mm or less, and wherein an upper surface of the support portion is flat, wherein the vertical direction is a direction from an upper surface to a lower surface of the lighting module.

6. The optical assembly of claim 4, comprising:

a step portion disposed around an upper periphery of the recess;

wherein an upper end of the curved surface in the reflective portion is disposed equal to or lower than a straight line extending horizontally with respect to a lower surface of the lighting module, wherein a periphery of the transparent cover is disposed on the step portion of the outer sidewall, and wherein a lower surface of the transparent cover is supported on an upper surface of the lighting module.

7. The optical assembly of claim 4, comprising a housing having the reflective portion, the support portion, the inner sidewall and the outer sidewall, and wherein a reflective layer of a metallic material is disposed on the reflective portion.

8. The optical assembly of claim 7, comprising a light blocking member disposed on an upper surface of the housing and the transparent cover and having an opening portion overlapping a partial region of the recess in a vertical direction, where the vertical direction is a direction from an upper surface to a lower surface of the lighting module.

9. The optical assembly of claim 2, wherein the exit surface is disposed higher than an upper end of the curved surface of the reflection portion, wherein an open region between the lighting module and the outer sidewall of the housing is an upper region of the recess and is a region connected to the receiving portion.

10. The optical assembly of claim 1, wherein the exit surface is disposed higher than an upper end of the curved surface of the reflection portion.

11. The optical assembly of claim 1, wherein an angle between the straight line extending along the length direction of the exit surface of the lighting module and the straight line extending along the length direction of the surface opposite is in a range of 10 degrees to 60 degrees, wherein the lighting module includes a first side surface and a second side surface facing each other, wherein the first side surface and the second side surface extend from both ends of the exit surface, wherein a length of the first side surface is greater than a length of the second side surface.

12. A rear-view mirror assembly comprising:

a housing including a support portion having a receiving portion in one region and a reflective portion having a concave recess in the other region;

a lighting module disposed in the receiving portion and having an exit surface exposed toward the recess;

a transparent cover disposed on the receiving portion and the recess; and a light blocking member disposed on an upper surface of the housing and the transparent cover and having an opening portion in a partial region overlapping the recess;

wherein a bottom of the recess has a curved surface having a deeper depth toward a lower end of one side of the exit surface, wherein the lighting module includes a substrate, a light emitting device on the substrate, and a resin layer covering the light emitting device, wherein the exit surface emits surface light, wherein the surface light is reflected by the reflective portion and emitted through the opening portion, where the length of the exit surface of the lighting module is greater than a length of a surface opposite to the exit surface, wherein a height of the exit surface of the lighting module is a same as a thickness of the resin layer in a vertical direction, wherein a straight line extending along a length direction of the exit surface of the lighting module is inclined with respect to a straight line extending along a length direction of a surface opposite to the exit surface.

13. The rear-view mirror assembly of claim 12, wherein the bottom of the recess has an aspherical curved surface and is disposed below a lower surface of the lighting module, the rear-view mirror assembly has a back plate and a rear-view mirror in which the housing is accommodated.

14. The rear-view mirror assembly of claim 13, further comprising at least one indicator formed on at least one region of the rear-view mirror and the light blocking member.

15. The rear-view mirror assembly of claim 12,
wherein an angle between the straight line extending along the length direction of the exit surface of the lighting module and the straight line extending along the length direction of the surface opposite of the exit surface is in a range of 10 to 60 degrees.

16. The rear-view mirror assembly of claim 12,
wherein the lighting module includes a first side surface and a second side surface facing each other,
wherein the first side surface and the second side surface extend from both ends of the exit surface, and
wherein a length of the first side surface is greater than a length of the second side surface.

17. The rear-view mirror assembly of claim 16,
wherein the light emitting device has a light emitting surface emitting light on one side,
wherein the straight line extending in the length direction of the exit of the lighting module and the straight line extending in a length direction of a light emitting surface of the light emitting device are arranged parallel to each other.

18. The rear-view mirror assembly of claim 12,
wherein the lighting module includes a first reflective member disposed on an upper surface of the resin layer and a second reflective member disposed between the substrate and a lower surface of the resin layer,
wherein an upper surface of the first reflective member and a lower surface of the second reflective member have a same area.

19. The rear-view mirror assembly of claim 12,
wherein an upper end of the curved surface in the reflective portion is disposed equal to or lower than a straight line extending horizontally from a lower surface of the lighting module,
wherein an outer sidewall of the housing faces the exit surface of the lighting module.

20. The rear-view mirror assembly of claim 12,
wherein an open region between the lighting module and an outer sidewall of the housing is an upper region of the recess and is a region connected to the receiving portion.

\* \* \* \* \*